(12) United States Patent
Beix et al.

(10) Patent No.: US 11,605,759 B2
(45) Date of Patent: Mar. 14, 2023

(54) OPTOELECTRONIC DEVICE COMPRISING LIGHT-EMITTING DIODES

(71) Applicants: Aledia, Echirolles (FR); Commissariat à l'Énergie Atomique et aux Énergies Alternatives, Paris (FR)

(72) Inventors: Vincent Beix, Chambery (FR); Thomas Lacave, Grenoble (FR); Marion Volpert, Grenoble (FR); Olivier Girard, Grenoble (FR); Denis Renaud, Grenoble (FR); Brigitte Soulier, Grenoble (FR)

(73) Assignees: Aledia, Echirolles (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 108 days.

(21) Appl. No.: 17/251,852

(22) PCT Filed: Jun. 18, 2019

(86) PCT No.: PCT/FR2019/051489
§ 371 (c)(1),
(2) Date: Dec. 14, 2020

(87) PCT Pub. No.: WO2019/243733
PCT Pub. Date: Dec. 26, 2019

(65) Prior Publication Data
US 2021/0257514 A1    Aug. 19, 2021

(30) Foreign Application Priority Data

Jun. 19, 2018 (FR) ...................................... 1855368

(51) Int. Cl.
*H01L 33/08* (2010.01)
*H01L 33/06* (2010.01)
(Continued)

(52) U.S. Cl.
CPC .............. *H01L 33/08* (2013.01); *H01L 33/06* (2013.01); *H01L 33/24* (2013.01); *H01L 33/32* (2013.01);
(Continued)

(58) Field of Classification Search
CPC ......... H01L 33/08; H01L 33/06; H01L 33/34; H01L 33/32; H01L 33/387; H01L 33/54;
(Continued)

(56) References Cited

U.S. PATENT DOCUMENTS 6,406,975 B1    6/2002  Lim et al.
6,791,155 B1    9/2004  Lo et al.
(Continued)

FOREIGN PATENT DOCUMENTS

FR          3 023 066 A1       1/2016
WO    WO 2015/044621 A2       4/2015
WO    WO 2017/109415 A1       6/2017

OTHER PUBLICATIONS

International Search Report and Written Opinion for International Application No. PCT/FR2019/051489, dated Nov. 21, 2019.
(Continued)

*Primary Examiner* — Mark W Tornow
(74) *Attorney, Agent, or Firm* — Wolf, Greenfield & Sacks, P.C.

(57) ABSTRACT

An optoelectronic device including a substrate having opposite first and second surfaces; insulation trenches extending through the substrate, surrounding portions of the substrate and electrically insulating the portions from each other, each insulation trench being filled with at least one electrically insulating block and a gaseous volume or being filled with an electrically conductive element electrically isolated from the substrate; at least one light-emitting diode resting on the first surface for each portion of the substrate, the light-
(Continued)

emitting diodes comprising wired, conical, or frustoconical semiconductor elements; an electrode layer covering at least one of the light-emitting diodes and a conductive layer overlying the electrode layer around the light-emitting diodes; and a layer encapsulating the light-emitting diodes and covering the entire first surface.

8 Claims, 7 Drawing Sheets (51) Int. Cl.
*H01L 33/24* (2010.01)
*H01L 33/32* (2010.01)
*H01L 33/38* (2010.01)
*H01L 33/54* (2010.01)
*H01L 33/62* (2010.01)

(52) U.S. Cl.
CPC ............ *H01L 33/387* (2013.01); *H01L 33/54* (2013.01); *H01L 33/62* (2013.01); *H01L 2933/005* (2013.01); *H01L 2933/0016* (2013.01); *H01L 2933/0066* (2013.01)

(58) Field of Classification Search
CPC ............. H01L 33/62; H01L 2933/0016; H01L 2933/005; H01L 2933/0066
See application file for complete search history.

(56) References Cited

U.S. PATENT DOCUMENTS 7,400,024 B2 7/2008 Kunnen
2016/0300881 A1* 10/2016 Bouvier .................. H01L 33/62

OTHER PUBLICATIONS

International Preliminary Report on Patentability for International Application No. PCT/FR2019/051489, dated Dec. 30, 2020.

* cited by examiner

Fig 9E

OPTOELECTRONIC DEVICE COMPRISING LIGHT-EMITTING DIODES

This application is a national stage filing under 35 U.S.C. § 371 of International Patent Application Serial No. PCT/FR2019/051489, filed Jun. 18, 2019 which claims the priority to of the French patent application FR18/55368, filed Jun. 19, 2018. The contents of these applications are incorporated herein by reference in their entireties.

BACKGROUND

The present invention generally relates to optoelectronic devices based on semiconductor materials. The present invention more specifically relates to optoelectronic devices comprising light-emitting diodes formed by three-dimensional elements, particularly semiconductor microwires or nanowires.

DISCUSSION OF THE RELATED ART

The term "optoelectronic devices with light-emitting diodes" designates devices capable of converting an electric signal into an electromagnetic radiation, and particularly devices dedicated to emitting an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter. Those three-dimensional elements are formed on a substrate, for example a semiconductor substrate.

It is desirable to be able to separately command sets of light-emitting diodes, or even individual light-emitting diodes, that are formed on the same substrate. However, this can lead to a device having a complex structure.

SUMMARY

An object of an embodiment aims at overcoming all or part of the disadvantages of the previously-described optoelectronic devices comprising light-emitting diodes, for example with microwires or nanowires.

Another object of an embodiment is that the optoelectronic device has a simple structure.

Another object of an embodiment is that the light-emitting diodes are formed on a semiconductor substrate.

Another object of an embodiment is to separately command sets of light-emitting diodes, or even individual light-emitting diodes, that are formed on the same substrate.

Another object of an embodiment is for optoelectronic devices comprising light-emitting diodes made of semiconductor material to be capable of being manufactured at an industrial scale and at a low cost.

Another object of an embodiment is that the optoelectronic device can be used with high voltages, for example from 1.5 V to 400 V.

Thus, an embodiment provides an optoelectronic device comprising:

a substrate having opposite first and second surfaces;

insulation trenches extending through the substrate from the first surface to the second surface, surrounding portions of the substrate and electrically insulating the portions from each other, each insulation trench being filled with at least one electrically insulating block and a gaseous volume or being filled with an electrically conductive element electrically isolated from the substrate;

at least one light-emitting diode resting on the first surface for each portion of the substrate, the light-emitting diodes comprising wired, conical, or frustoconical semiconductor elements;

an electrode layer covering at least one of the light-emitting diodes and a conductive layer overlying the electrode layer around the light-emitting diodes; and a layer encapsulating the light-emitting diodes and covering the entire first surface.

According to an embodiment, the device comprises, for each portion of the substrate, at least a first conductive pad resting on the second surface and in contact with the portion of the substrate.

According to an embodiment, each insulation trench comprises side walls and an electrically insulating layer covering the side walls.

According to an embodiment, each insulation trench is at least partially filled by said at least one electrically insulating block, said at least one electrically insulating block and the electrically insulating layer being made of different materials.

According to an embodiment, each insulation trench comprises said electrically conductive element, the electrically conductive elements being electrically connected, on the side of the first surface, to the electrode layer or to the conductive layer, and being electrically connected, on the side of the second surface, to second electrically conductive pads.

An embodiment also provides a method of manufacturing an optoelectronic device comprising the following successive steps:

providing a substrate having opposite first and second surfaces;

forming insulation trenches extending in the substrate from the first surface to the second surface, surrounding portions of the substrate and electrically insulating the portions from each other, each insulation trench being filled with at least one electrically insulating block and a gaseous volume or being filled with an electrically conductive element electrically isolated from the substrate;

forming at least one light-emitting diode resting on the first surface for each portion of the substrate, the light-emitting diodes comprising wired, conical, or frustoconical semiconductor elements;

forming an electrode layer covering at least one of the light-emitting diodes and a conductive layer covering the electrode layer around the light-emitting diodes;

forming a layer encapsulating the light-emitting diodes and covering the entire first surface.

According to an embodiment, the method comprises the following successive steps:

a) providing the substrate comprising the first surface;

b) partially forming the insulation trenches in the substrate from the first surface, the trenches in step b) not completely crossing the substrate;

c) forming light-emitting diodes resting on the first surface;

d) forming the electrode layer covering at least one of the light-emitting diodes and the conductive layer covering the electrode layer around the light-emitting diodes;

e) covering the entire first surface with the layer encapsulating the light-emitting diodes; and f) reducing the thickness of the substrate, the substrate comprising, after step f), the second surface opposite the first surface, the insulation trenches extending, after step f), from the first surface to the second surface and surrounding the portions of the substrate and electrically insulating the portions from one another.

According to an embodiment, the method comprises, prior to step b), for each insulation trench, etching an opening in the substrate from the first surface over a part of the thickness of the substrate, the opening being opened on the second surface in step f).

According to an embodiment, each insulation trench comprises side walls, the method comprising forming an electrically insulating layer covering the side walls.

According to an embodiment, each insulation trench is at least partially filled by said at least one electrically insulating block, said at least one electrically insulating block and the electrically insulating layer being made of different materials.

According to an embodiment, each insulation trench comprises said electrically conductive element, the electrically conductive elements being electrically connected, on the side of the first surface, to the electrode layer or the conductive layer, the method comprising forming, on the second surface, second electrically conductive pads electrically connected to the electrically conductive elements.

According to an embodiment, the method comprises the following successive steps:

etching into the substrate, on the side of the second surface, openings at the locations of the insulation trenches; and forming, in the openings, the electrically insulating blocks.

According to an embodiment, the method comprises a step of fixing a support to the layer encapsulating the light-emitting diodes.

According to an embodiment, the method comprises forming, for each portion of the substrate, at least a first conductive pad resting on the second surface and in contact with the portion of the substrate.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the optoelectronic device control means described hereafter are within the abilities of those skilled in the art and are not described.

In the following description, unless otherwise indicated, the terms "substantially", "approximately", and "in the order of" mean "to within 10%". Further, "compound mainly formed of a material" or "compound based on a material" means that a compound comprises a proportion greater than or equal to 95% of said material, this proportion being preferentially greater than 99%.

The present description relates to optoelectronic devices comprising three-dimensional elements, for example, microwires, nanowires, conical elements, or tapered elements. In the following description, embodiments are described for optoelectronic devices comprising microwires or nanowires. However, these embodiments may be implemented for three-dimensional elements other than microwires or nanowires, for example, pyramid-shaped three-dimensional elements.

The term "microwire" or "nanowire" designates a three-dimensional structure having an elongated shape along a preferential direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest of the minor dimensions. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, the term "wire" is used to mean "microwire or nanowire". Preferably, the average line of the wire which runs through the centers of gravity of the cross-sections, in planes perpendicular to the preferential direction of the wire, is substantially rectilinear and is called "axis" of the wire hereafter.

Figure 1:
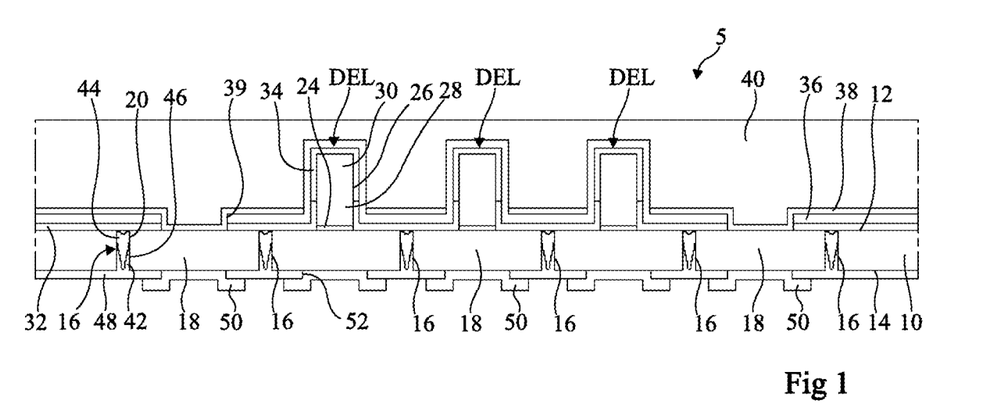
FIGS. 1 and 2 are respectively a partial simplified cross-section view and a partial simplified top view of an embodiment of an optoelectronic device.
Figure 2:
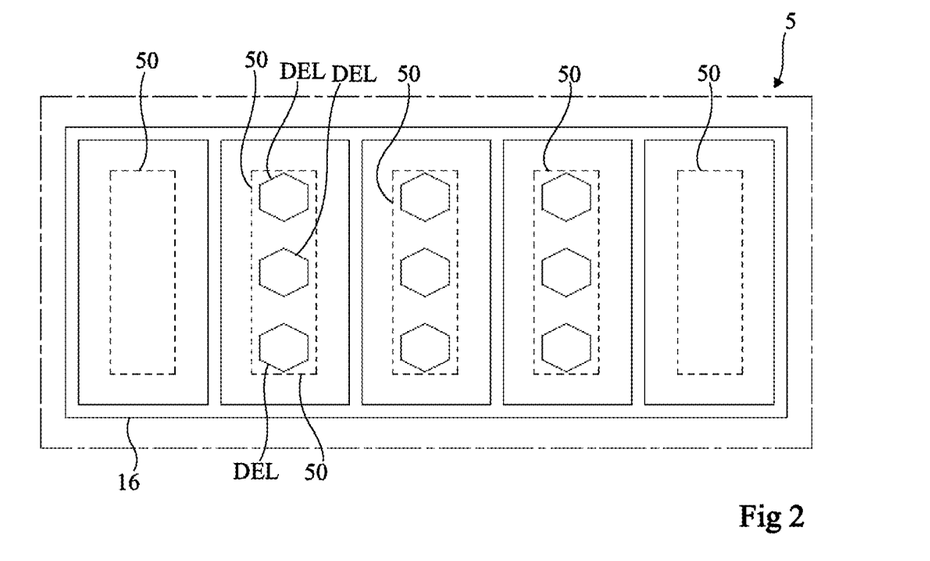

FIGS. 1 and 2 are respectively a partial simplified cross-section view and a partial simplified top view of an embodiment of an optoelectronic device 5. Optoelectronic device 5 comprises a substrate 10 having a front surface 12 and a rear surface 14 opposed to front surface 12. Optoelectronic device 5 comprises electrical insulation trenches 16 which extend over the entire thickness of substrate 10. Trenches 16 completely surround portions 18 of substrate 10 and laterally electrically isolate portions 18 of the substrate 10. Each trench 16 comprises an opening 20 passing through substrate 10 from front surface 12 to rear surface 14 of substrate 10 and surrounding one of portions 18 of substrate 10.

Optoelectronic device 5 further comprises:

seed pads 24 promoting the growth of wires and arranged on surface 12;

wires 26, each wire 26 being in contact with one of seed pads 24, each wire 26 comprising a lower portion 28, in contact with seed pad 24 and an upper portion 30, continuing lower portion 28;

an insulating layer 32 extending on surface 12 of substrate 10 and on the lateral sides of lower portion 28 of each wire 26;

a shell 34 comprising a stack of semiconductor layers covering each upper portion 30;

a layer 36 forming a first electrode covering each shell 30 and further extending on insulating layer 32; and a conductive layer 38 covering electrode layer 36 between wires 26 without extending on wires 26 et coming into contact with portions 18 of substrate 10 through openings 39 provided on layers 36 and 32; and an encapsulation layer 40 on the entire substrate 10.

Electrode layer 36, conductive layer 38 and encapsulation layer 40 are not shown in FIG. 2.

As a variation, for each wire 26, shell 34 can cover completely or at least partly the lower portion 28 of wire 26, shell 34 being interposed between insulating layer 32 and lower portion 28 of wire 26.

The assembly formed by each wire 26, the associated seed pad 24, and shell 34 forms alight-emitting diode DEL. The base of diode DEL corresponds to seed pad 24. Shell 34 particularly comprises an active layer which is the layer from which most of the electromagnetic radiation delivered by light-emitting diode DEL is emitted.

At least one light-emitting diode DEL is formed on each portion 18 of substrate 10, three light-emitting diodes being shown on each portion 18 of substrate 10 in FIG. 2. The number of light-emitting diodes DEL per portion 18 of substrate 10 may vary from 1 to 100000.

According to one embodiment, each opening 20 is partly filled with at least one block 42 made of an electrically insulating material and partly filled with a gas mixture 44, at atmospheric pressure or in a partial vacuum, that is to say at a pressure between 10 Pa and 105 Pa. The block or blocks 42 at least partially cover the internal side walls 46 of the trench 16.

By way of example, each opening 20 has a width that varies from 300 nm to 10 μm. The thickness of the thinned substrate 10 varies from 100 nm to 200 μm. The ratio between the width and the depth of each opening 20 (the depth of each opening 20 being equal to the thickness of the thinned substrate 10) varies from 3 to 100.

Optoelectronic device 5 comprises an electrically insulating layer 48 covering rear surface 14 of thinned substrate 10. Insulating layer 48 may be interrupted at least at some of the trenches 16 when the gas volume 44 of trench 16 is opened on rear surface 14. Optoelectronic device 5 further comprises electrically conductive pads 50 in openings 52 formed in insulating layer 48. Conductive pads 50 are shown in dotted lines in FIG. 2.

Insulating layer 48 may at least partly cover the periphery of each of each conductive pad 50. Conductive pads 50 are in contact with rear surface 14 of substrate 10. Insulating layer 48 is in the same material as insulating block 42.

An advantage of the present embodiment is that the mechanical stresses due to insulating blocks 42 of trenches 16 are reduced since insulating blocks 42 do not completely fill the trenches 16. Moreover, the gas volume 44 forms a material without mechanical stress, expandable and that provides electrical insulation.

Substrate 10 may correspond to a one-piece structure or correspond to a layer covering a support made of another material. Substrate 10 for example is a semiconductor substrate, preferably a semiconductor substrate compatible with manufacturing methods implemented in microelectronics, for example, a substrate made of silicon, germanium, or an alloy of these compounds. The substrate is doped so that the substrate resistivity is lower than a few mohm·cm. Preferably, substrate 10 is a semiconductor substrate, such as a silicon substrate. Substrate 10 may be doped with a first conductivity type, for example, N-type doped. Surface 12 of substrate 20 may be a <100> or <111> surface.

The insulating material constituting blocks 42 and insulating layer 48 may be chosen from the group comprising silicon oxide ($SiO_2$), silicon oxynitride (SiON), silicon nitride (SiN), aluminum nitride (AlN), titanium oxide ($TiO_2$), aluminum oxide ($Al_2O_3$), electrically insulating organic materials, for example parylene or ALX resin and the mixtures of at least two of these compounds. An advantage of the use of parylene is that this material does not lead to the generation of strong mechanical stresses in optoelectronic device 5. According to one embodiment, the thickness of the insulating layer 48 varies from 1 nm and 0.5 μm.

Seed pads 24, also called seed islands, are made of a material promoting the growth of wires 26. As a variation, seed pads 24 may be replaced with a seed layer covering surface 12 of substrate 10. In the case of seed pads, a treatment may further be provided to protect the lateral edges of the seed pads and the surface of the substrate portions which are not covered with the seed pads to prevent wires from growing on the lateral sides of the seed pads and on the surface of the substrate portions which are not covered with the seed pads. The treatment may comprise forming a dielectric region on the lateral sides of the seed pads and extending on top of and/or inside of the substrate and connecting, for each pair of pads, one of the pads of the pair to the other pad in the pair, with no wire growth on the dielectric region.

As an example, the material forming seed pads 24 may be a nitride, a carbide, or a boride of a transition metal from column IV, V, or VI of the periodic table of elements or a combination of these compounds. As an example, seed pads 24 may be made of aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate ($ZrB_2$), zirconium nitride (ZrN), silicon carbide (SiC), tantalum carbo-nitride (TaCN), magnesium nitride in $Mg_xN_y$ form, where x is approximately equal to 3 and y is approximately equal to 2, for example, magnesium nitride in $Mg_3N_2$ form or magnesium gallium nitride (MgGaN), tungsten (W), tungsten nitride (WN), or a combination thereof. Seed pads 24 may be doped with the same conductivity type as substrate 10 or with the opposite conductivity type.

Insulating layer 32 may be made of a dielectric material, for example, silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond. As an example, the thickness of insulating layer 32 is in the range from 5 nm to 5 μm, for example, equal to approximately 1 μm.

Wires 26 may be at least partly formed based on at least one semiconductor material. The semiconductor material may be silicon, germanium, silicon carbide, a III-V compound, a II-VI compound, or a combination of these compounds.

Wires 26 may be at least partly formed of semiconductor materials mainly comprising a III-V compound, for example, III-N compounds. Examples of group-If elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 26 may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 26 may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires 26 may have different shapes, such as, for example, oval, circular, or polygonal, particularly triangular, rectangular, square, or hexagonal. It should thus be understood that the term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section. The average diameter of each wire 26 may be in the range from 50 nm to 2.5 µm. Height of each wire 26 may be in the range from 250 nm to 50 µm.

Each wire 26 may have an elongated semiconductor structure along an axis D substantially perpendicular to surface 12. Each wire 26 may have a general cylindrical shape. The axes of two wires 26 may be distant by from 0.1 µm to 10 µm, and preferably from 1.5 µm to 4 µm. As an example, wires 26 may be regularly distributed. As an example, wires 26 may be distributed in a hexagonal network.

As an example, lower portion 28 of each wire 26 is mainly formed of the III-N compound, for example, gallium nitride, having a doping of the first conductivity type, for example, silicon. Lower portion 28 extends up to a height which may be in the range from 100 nm to 25 µm.

As an example, upper portion 30 of each wire 26 is at least partially made of a III-N compound, for example, GaN. Upper portion 30 may be doped with the first conductivity type, or may not be intentionally doped. Upper portion 30 extends up to a height which may be in the range from 100 nm to 25 µm.

In the case of a wire 26 mainly made of GaN, the crystal structure of wire 26 may be of wurtzite type, the wire extending along axis D. The crystal structure of wire 26 may also be of cubic type.

Shell 34 may comprise a stack of an active layer covering upper portion 30 of the associated wire 26, and possibly also totally or partly the lower portion 28, and of a bonding layer between the active layer and electrode 36.

The active layer is the layer from which most of the radiation delivered by light-emitting diode DEL is emitted. According to an example, the active layer may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

The bonding layer may correspond to a semiconductor layer or to the stack of semiconductor layers and enables to form a P-N or P-I-N junction with the active layer and/or upper portion 30. It enables to inject holes into the active layer via electrode 36. The stack of semiconductor layers may comprise an electron barrier layer made of a ternary alloy, for example, aluminum gallium nitride (AlGaN) or aluminum indium nitride (AlInN) in contact with the active layer and an additional layer, to provide a good electric contact between electrode 36 and the active layer, for example, made of gallium nitride (GaN) in contact with the electron barrier layer and with electrode 36. The bonding layer may be doped with the conductivity type opposite to that of portion 30, for example, P-type doped.

Electrode 36 is capable of biasing the active layer of each wire 26 and of letting through the electromagnetic radiation emitted by light-emitting diodes DEL. The material forming electrode 36 may be a transparent and conductive material such as indium tin oxide (ITO), aluminum zinc oxide, or graphene. As an example, electrode 36 has a thickness in the range from 10 nm to 300 nm according to the desired emission wavelength.

Conductive layer 38 may be a single layer or correspond to a stack of two layers or of more than two layers. Conductive layer 38 may further be capable of at least partly reflecting the radiation emitted by light-emitting diodes DEL. As an example, conductive layer 38 corresponds to a metal monolayer. According to another example, conductive layer 38 corresponds to a stack of layers for example comprising a metal layer covered with a dielectric layer or with a plurality of dielectric layers. The metal layer of conductive layer 38 may be formed on a bonding layer, for example, made of titanium. As an example, the material forming the metal layer of conductive layer 38 (monolayer or multilayer) may be aluminum, an alloy based on aluminum, particularly $AlSi_z$, $Al_xCu_y$, (for example, with x equal to 1 and y equal to 0.8%), silver, gold, nickel, chromium, rhodium, ruthenium, palladium, or an alloy of two of these compounds or of more than two of these compounds. As an example, conductive layer 38 (monolayer or multilayer) has a thickness in the range from 100 nm to 2,000 nm.

The encapsulation layer 40 can have a single or multilayer structure. According to one embodiment, the encapsulation layer 40 comprises at least one layer deposited by a conformal deposition process. According to one embodiment, the encapsulation layer 40 comprises at least a first layer deposited by a conformal deposition process and in contact with the conductive layer 38 and the electrode layer 36, and at least a second filling layer of the spaces between the light-emitting diodes so as to obtain a substantially planar front surface.

The encapsulation layer 40, or at least one of the layers which compose it when the encapsulation layer 40 has a multilayer structure, may further comprise a suitable photoluminescent material, when it is excited by the light emitted by the light-emitting diodes, to emit light at a wavelength different from the wavelength of light emitted by the light-emitting diodes.

The maximum thickness of encapsulation layer 40 is in the range from 1 µm to 1,000 µm, for example, approximately 30 µm, so that encapsulation layer 40 totally covers electrode 36 at the top of light-emitting diodes DEL. Encapsulation layer 40 is made of an at least partially transparent insulating material. Encapsulation layer 40 may be made of an at least partially transparent inorganic material. As an example, the inorganic material is selected from the group comprising silicon oxides, of type $SiO_x$ where x is areal number between 1 and 2, or $SiO_yN_z$ where y and z are real numbers between 0 and 1, and aluminum oxides, for example, $Al_2O_3$. Encapsulation layer 40 may be made of an at least partially transparent organic material or organic materials. As an example, encapsulation layer 40 is a silicone polymer, an epoxide polymer, an acrylic polymer, or a polycarbonate.

Figure 3:
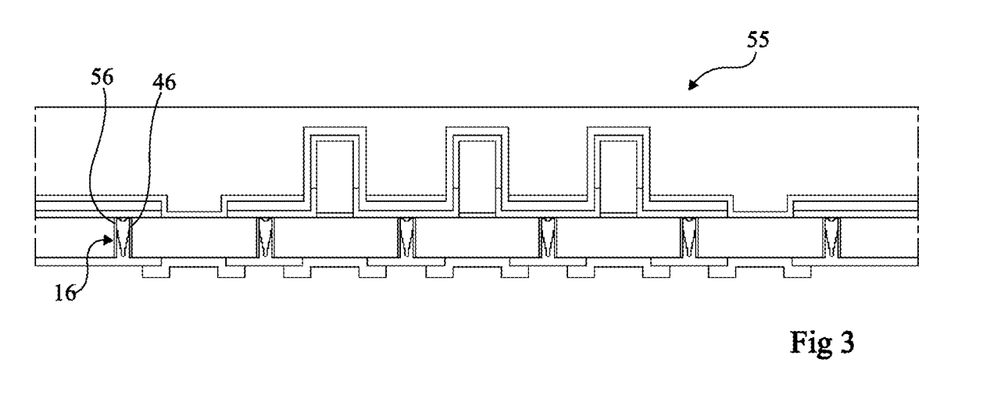
FIGS. 3 to 5 are partial simplified cross-section views of other embodiments of optoelectronic devices.

FIG. 3 is a cross-section view of an embodiment of an optoelectronic device 55. Optoelectronic device 55 comprises all the elements of optoelectronic device 5 and further comprises, for each electrical isolation trench 16, an electrically insulating layer 56 covering the side walls 46 of electrical isolation trench 16. Insulating layers 56 may be made of an electrically insulating material different from the insulating material constituting insulating blocks 42. The insulating material constituting insulating layers 56 may be chosen from the group comprising $SiO_2$, SiON, SiN, AlN, $TiO_2$, $Al_2O_3$ and the mixtures of at least two of these compounds. Each insulating layer 56 has a thickness in the range from 1 nm to 500 nm. Preferably, insulating layers 56 are made of silicon oxide obtained by a thermal oxidation process or by atomic layer deposition (ALD).

Figure 4:
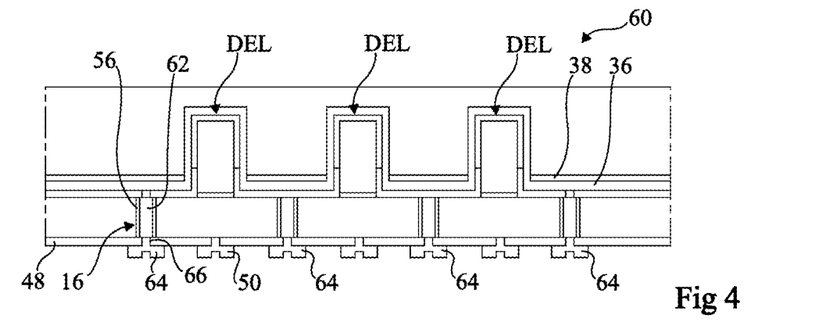

FIG. 4 is a cross-section view of an embodiment of an optoelectronic device 60. Optoelectronic device 60 comprises all the elements of optoelectronic device 55 with the difference that insulating blocks 42 are replaced by electrically conductive elements 62 filling trenches 16. Electrically conductive elements 62 are made of an electrically conductive material selected from the group comprising metals, in particular copper (Cu) or tungsten (W), and polycrystalline silicon, possibly doped.

Conductive elements 62 are electrically isolated from substrate 10 by insulating layers 56. Conductive elements 62 are connected to electrode layer 36 or conductive layer 38 of light-emitting diodes DEL. Optoelectronic device 60 comprises electrically conductive pads 64 in contact with conductive elements 62 in openings 66 formed in insulating layer 48. Trenches 16 then act both as electrical isolation trenches laterally insulating portions 18 of substrate 10 and as through vias providing an electrical connection between surfaces 12 and 14 of substrate 10.

An advantage of the optoelectronic devices of FIGS. 3 and 4 is that they can be used with high voltages, for example from 1.5 V to 400 V, depending on the thickness of the thermal oxide layer 56.

Figure 5:
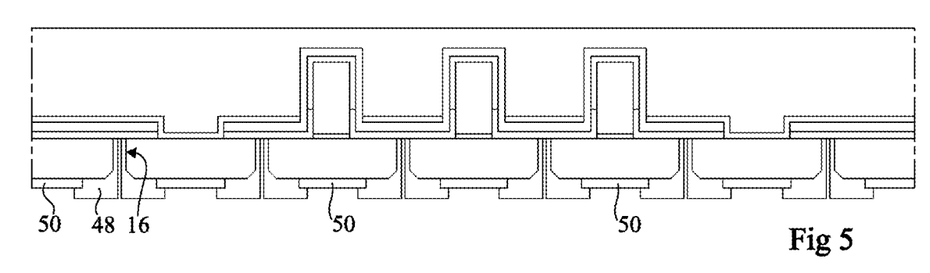

FIG. 5 is a cross-section view of an embodiment of an optoelectronic device 70. Optoelectronic device 70 comprises all the elements of optoelectronic device 5, with the difference that insulating layer 48 partially covers the periphery of conductive pads 50.

FIGS. 6A to 6F are partial and schematic cross-section views of structures obtained at successive steps of an embodiment of a method for manufacturing optoelectronic device 5 shown in FIGS. 1 and 2.

Figure 6A:
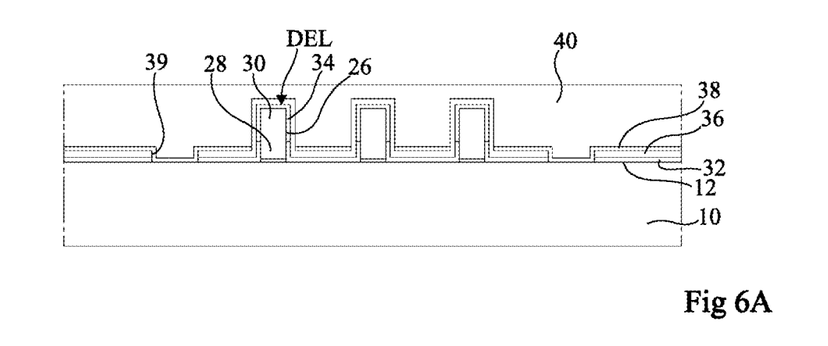
FIGS. 6A to 6F are partial simplified cross-section views of the structures obtained at successive steps of an embodiment of a method of manufacturing the optoelectronic device shown in FIG. 1.

FIG. 6A shows the structure obtained after the formation of light-emitting diodes DEL, insulating layer 32, electrode layer 36, conductive layer 38 and encapsulation layer 40 on surface 12 of substrate 10.

The initial thickness of substrate 10 is greater than the targeted final thickness. Substrate 10 may correspond to a single-crystal silicon wafer having an initial thickness in the range from 500 µm to 1,500 µm, for example, approximately 725 µm, and having a diameter in the range from 100 mm to 450 mm, for example, approximately 200 mm or 300 nm. Advantageously, it is a silicon wafer currently used in methods of circuit manufacturing in microelectronics, particularly based on metal-oxide field-effect transistors or MOS transistors. As a variation, any other single-crystal semiconductor compatible with microelectronics manufacturing methods such as germanium may be used. Preferably, the semiconductor substrate is doped to decrease the electric resistivity of the substrate to an acceptable level for the series resistance of the light-emitting diode and to a resistivity close to that of metals, preferably smaller than a few mohm·cm.

The formation of the light emitting diodes DEL can include the steps disclosed in U.S. Pat. No. 9,537,044, and in particular the formation of seed pads 24 on face 12 of substrate 10, the growth of wires 26 on seed pads 24 and the formation, for each wire 26, of layers making up shell 34. The insulating layer 32 can be formed, for example by conformal deposition of an insulating layer over the entire structure and etching of this layer to expose shell 34 of each wire 26. In the previously described embodiment, insulating layer 32 does not cover shell 34. Alternatively, insulating layer 32 may cover a portion of shell 34. Further, insulating layer 32 may be made before the formation of shell 34.

Electrode 36 is, for example, formed by conformal deposition.

Conductive layer 38 is, for example, formed by physical vapor deposition (PVD) over the entire structure obtained at step 7) and etching this layer to expose each wire 26.

When encapsulation layer 40 is formed in an inorganic material, it may be deposited by low-temperature CVD, particularly at a temperature lower than 300° C.-400° C., for example by PECVD (plasma enhanced chemical vapor deposition). When encapsulation layer 40 is formed in an organic material, it may be deposited by a spin coating method, by an inkjet printing method, by a silk-screening method or by a film lamination method. A method of dispensing by time/pressure dispenser or by volumetric dispenser is also possible in automated mode on programmable equipment. Encapsulation layer 40 may be formed on the entire substrate 10.

Figure 6B:
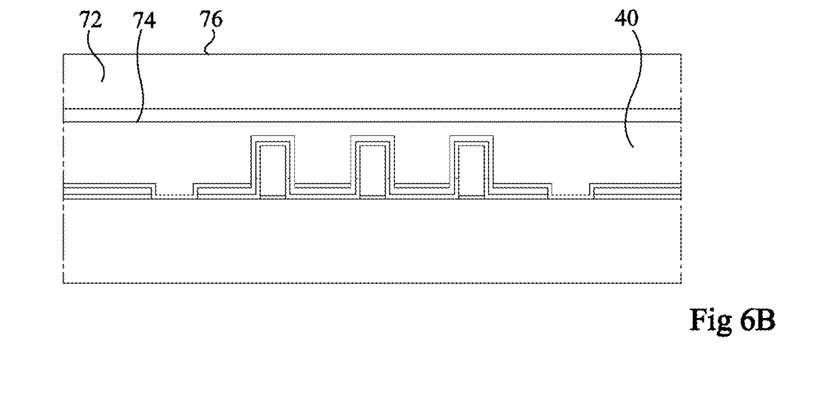

FIG. 6B shows the structure obtained after attaching the structure shown in FIG. 6A, on the side of encapsulation layer 40, to an additional support 72, called handle, possibly via a layer of glue 74. As an example, the handle 72 has a thickness in the range from 100 µm to 1,500 µm. According to an embodiment, handle 72 is intended to be kept on the optoelectronic devices once sawn. Handle 72 then is made of an at least partly transparent material. It may be glass, particularly a borosilicate glass, for example, Pyrex, or sapphire. Moreover, the adhesive layer 74 is also made of an at least partially transparent material. An observer perceives the light rays emitted by light-emitting diodes DEL which cross surface 76 of handle 72 opposite to encapsulation layer 40.

According to another embodiment, handle 72 is intended to be removed at a subsequent step of the manufacturing method. In this case, handle 72 may be made of any type material compatible with the subsequent steps of the manufacturing method. It may be silicon or any planar substrate compatible with microelectronics flatness criteria.

Handle 72 may be attached to encapsulation layer 40 by any means, for example, by gluing, for example by using the layer 74 of organic temperature-crosslinkable glue, for example in a thermoplastic or thermosetting material, or also by molecular bonding (direct bonding) or optical bonding with UV-cured glue. When encapsulation layer 40 is made of an organic material, this material may be used as glue for handle 72. When a glue layer is used, it should be at least partially transparent.

Figure 6C:
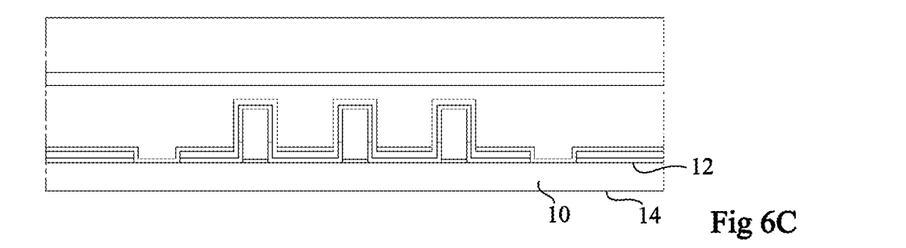

FIG. 6C shows the structure obtained after a step of thinning substrate 10. After thinning, the thickness of substrate 10 may be in the range from 1 µm to 200 µm, for example, approximately 30 µm. The thinning step may be carried out by one or more than one milling or etching step, and/or by chemical mechanical polishing methods (CMP). Thinned substrate 10 comprises surface 14 opposite to surface 12. Surfaces 12 and 14 are preferably parallel.

Figure 6D:
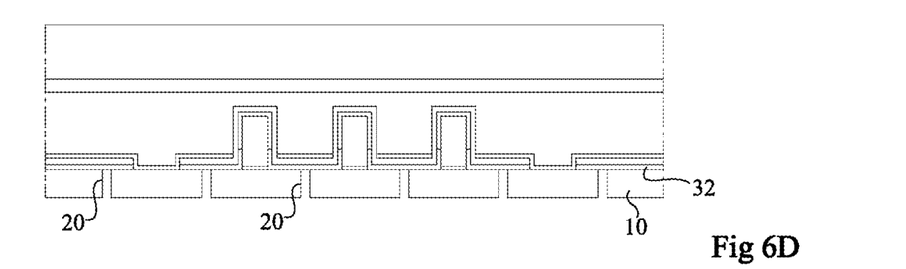

FIG. 6D shows the structure obtained after the formation of openings 20 crossing through substrate 10 and stopping on insulating layer 32. Openings 20 may be formed deep by etching substrate 10. The etching of substrate 10 may be a deep reactive ion etching (DRIE).

Figure 6E:
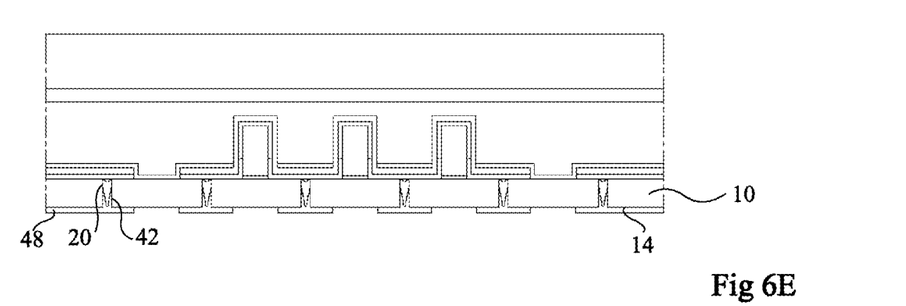

FIG. 6E shows the structure obtained after the formation of blocks 42 in openings 20, the formation of insulating layer 48 on rear surface 14 of thinned substrate 10 and the etching of insulating layer 48 to expose portions of rear surface 14 of substrate 10. It may be a deposition which leads to a partial filling of openings 20, for example by PECVD. The etching of insulating layer 48 is also performed by plasma etching with the chemistry adapted to insulating layer 48. An advantage of the manufacturing method is that openings 20 are partially filled by blocks 42. There are therefore less constraints on the deposition process used to form blocks 42 and insulating layer 48 and on the width/depth ratio of openings 20 since a complete filling of openings 20 is not desired.

Figure 6F:
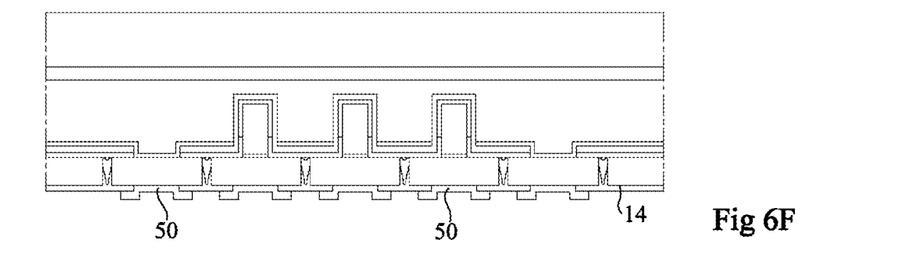

FIG. 6F shows the structure obtained after the forming of conductive pads 50 on surface 14. Each conductive pad 50 may have a monolayer or multilayer structure. Each conductive pad 50 comprises for example a TiCu or TiAl layer. This layer may be covered with another metal layer, for example, gold, copper, or eutectic alloys (Ni/Au or Sn/Ag/Cu) to implement a soldering method. Conductive pads 50 may be formed, particularly in the case of copper, by electrochemical deposition (ECD). The thickness of conductive pads 50 may be in the range from 0.1 µm to 30 µm, for example, approximately 1 µm.

FIGS. 7A to 7G are partial and schematic cross-section views of structures obtained at successive steps of an embodiment of a method of manufacturing optoelectronic device 55 shown in FIG. 3.

Figure 7A:
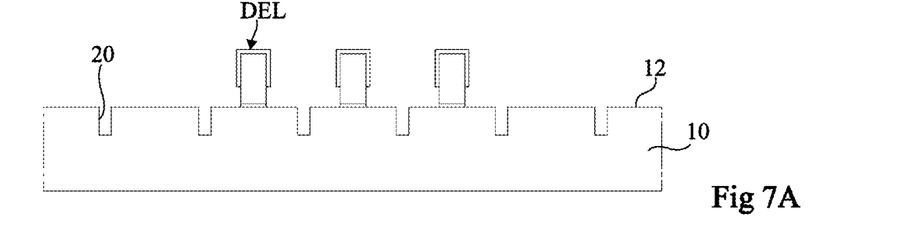
FIGS. 7A to 7G are partial simplified cross-section views of the structures obtained at successive steps of an embodiment of a method of manufacturing the optoelectronic device shown in FIG. 3.
Figure 7B:
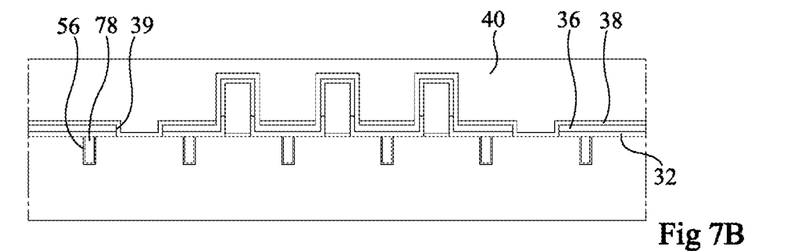

The present embodiment of the method of manufacturing optoelectronic device 55 comprises the following steps:

forming openings 20 in substrate 10 on the side of the front surface 12 (FIG. 7A) after the formation of the light emitting diodes DEL and before the formation of insulating layer 32, electrode layer 36, conductive layer 38 and encapsulation layer 40. Openings 20 can be formed by an etching of the DRIE type. The depth of each opening 20 is strictly greater than the thickness of substrate 10 after the thinning step. By way of example, the depth of each opening 20 is in the range from 1 µm and 200 µm, for example in the order of 35 µm;

forming insulating layers 56 in openings 20, filling openings 20 with filling elements 78, forming insulating layer 32, electrode layer 36, openings 39 in layers 32 and 36, conductive layer 38 and encapsulation layer 40 (FIG. 7B). An advantage of the present manufacturing method is that, insulating layers 56 being formed in the first steps of the manufacturing method of optoelectronic device 55, they can be manufactured by a process that requires the application of high temperatures, for example greater than 700° C. making it possible to obtain a material having improved electrical insulation properties. Insulating layers 56 may for example be formed by thermal oxidation. Insulating layers 56 may be present at the bottom of the openings 20. The filling element 78 may be made of polycrystalline silicon, doped or undoped, or of metal, deposited by example by ALD or ECD;

fixing the structure shown in FIG. 7B to the handle 72, possibly via adhesive layer 74 (FIG. 7C), as previously described in relation with FIG. 6B;

thinning substrate 10 (FIG. 7D) as previously described in relation with FIG. 6C to expose filler elements 78;

removing filling elements 78 (FIG. 7E) for example by an etching selective with respect to the materials composing substrate 10, insulating layers 56 and insulating layer 32, for example a wet etching using potassium hydroxide (KOH) or tetramethylammonium hydroxide (TMAH), or a photolithography etching process comprising a step of photolithography and a step of wet or dry etching. An advantage of the present embodiment is that the mechanical stresses that may result from the presence of filler elements 78 are eliminated;

formation of blocks 42 in openings 20 and formation of insulating layer 48 on rear surface 14 of thinned substrate 10 and etching of insulating layer 48 to expose portions of rear surface 14 of substrate 10 (FIG. 7F) as previously described in relation with FIG. 6E; and formation of conductive pads 50 (FIG. 33G) on surface 14 as described previously in relation with FIG. 6F.

FIGS. 8A to 8G are partial and schematic cross-section views of structures obtained at successive steps of an embodiment of a method of manufacturing the optoelectronic device 60 shown in FIG. 4.

Figure 7C:
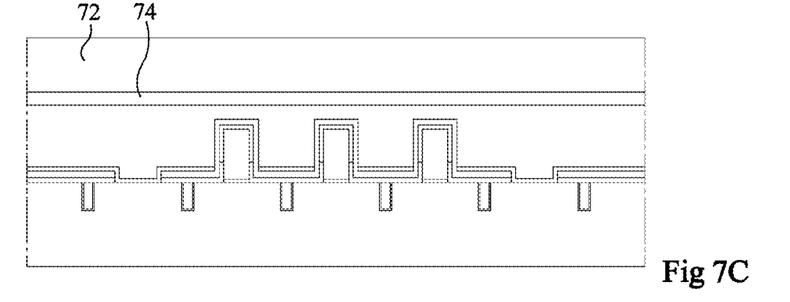
Figure 7D:
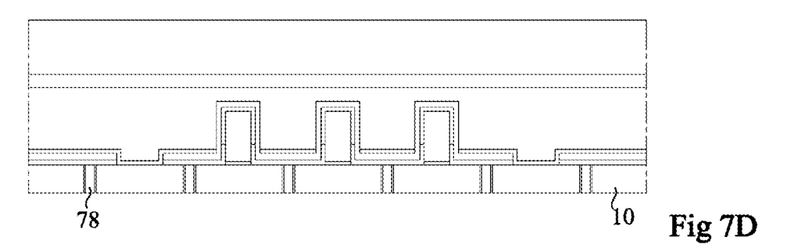
Figure 7E:
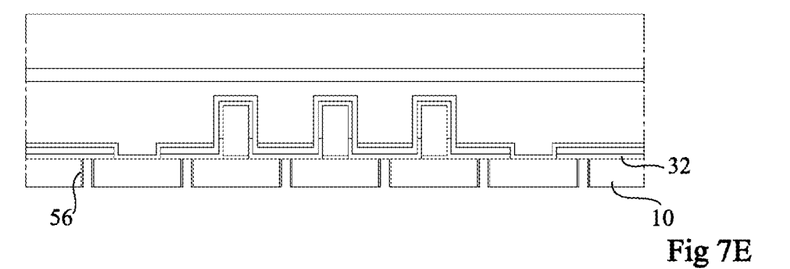
Figure 7F:
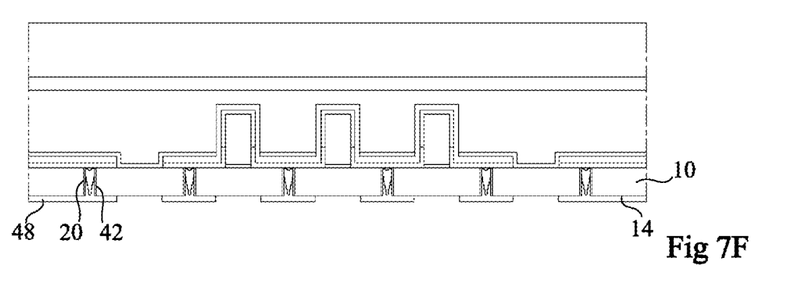
Figure 7G:
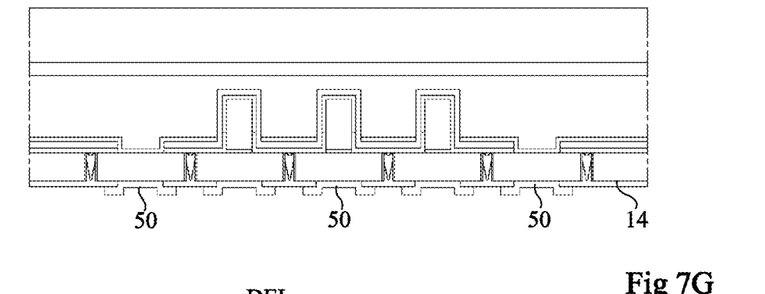
Figure 8A:
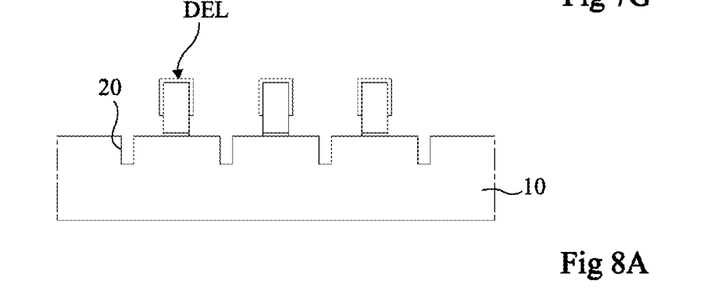
FIGS. 8A to 8G are partial simplified cross-section views of the structures obtained at successive steps of an embodiment of a method of manufacturing the optoelectronic device shown in FIG. 4.
Figure 8B:
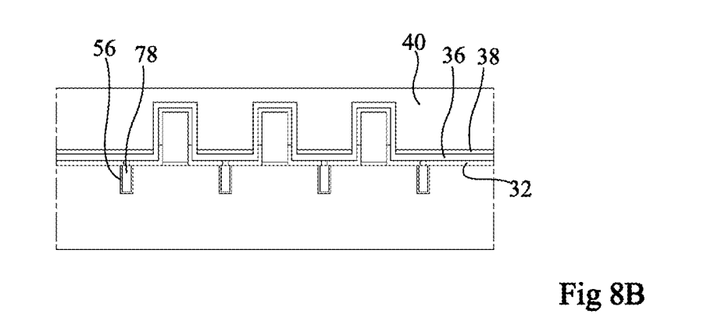
Figure 8C:
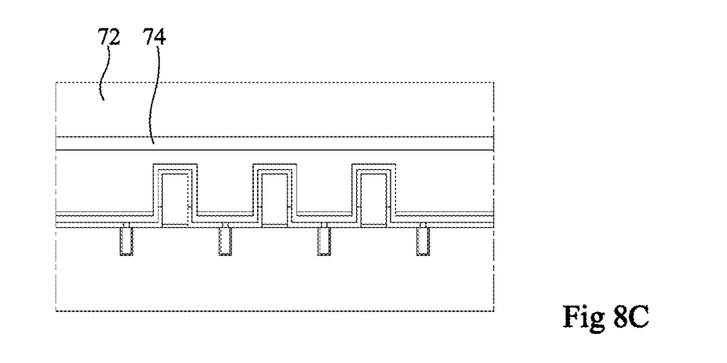
Figure 8D:
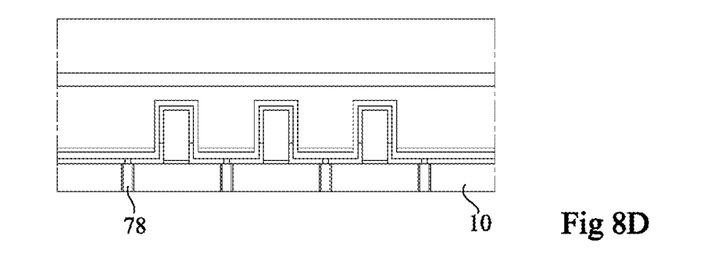
Figure 8E:
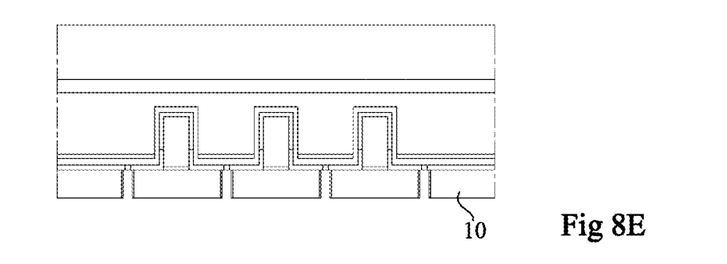
Figure 8F:
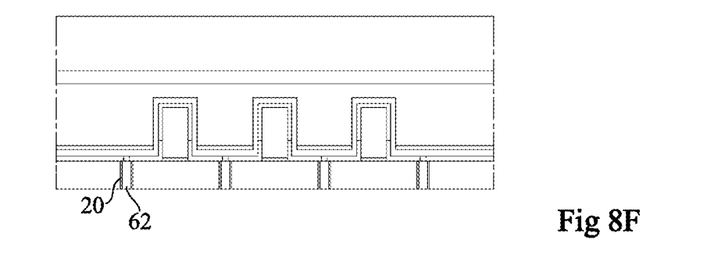
Figure 8G:
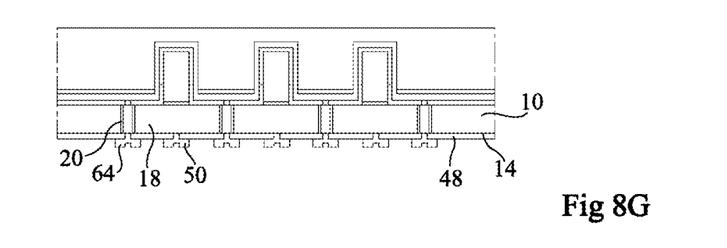

The present embodiment of the method of manufacturing optoelectronic device 60 comprises the following steps:

forming openings 20 in substrate 10 (FIG. 8A) before the formation of the light emitting diodes DEL and before the formation of insulating layer 32, electrode layer 36, conductive layer 38 and encapsulation layer 40 as previously described in relation with FIG. 7A;

forming insulating layers 56 in openings 20, filling openings 20 with filling elements 78, forming insulating layer 32, electrode layer 36, conductive layer 38 and encapsulation layer 40 (FIG. 8B) as previously described in relation with FIG. 7B;

attaching the structure shown in FIG. 8B to handle 72, optionally via glue layer 74 (FIG. 8C), as previously described in relation with FIG. 7C;

thinning substrate 10 (FIG. 8D) as previously described in relation with FIG. 7D until the filler elements 78 are exposed;

removing filler elements 78 (FIG. 8E) as previously described in relation with FIG. 7E;

forming conductive blocks 62 in openings 20 for example Cu, Al or Ti (FIG. 8F); and forming insulating layer 48 on rear surface 14 of thinned substrate 10, etching insulating layer 48 to expose portions of rear surface 14 of substrate 10 and forming conductive pads 50 in contact with substrate portions 18 and conductive pads 64 in contact with conductive blocks 62 (FIG. 8G).

Alternatively, the steps previously described in relation with FIGS. 8E and 8F may not be present. Conductive blocks 62 then correspond to filling elements 78.

FIGS. 9A to 9E are partial and schematic cross-section views of structures obtained at successive steps of an embodiment of a method of manufacturing optoelectronic device 70 shown in FIG. 5.

Figure 9A:
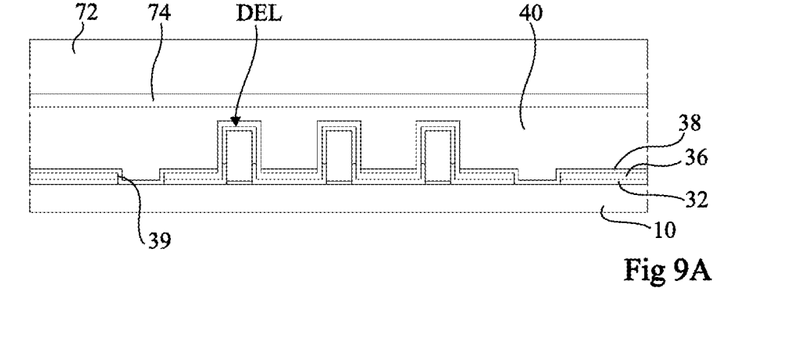
FIGS. 9A to 9E are partial simplified cross-section views of the structures obtained at successive steps of an embodiment of a method of manufacturing the optoelectronic device shown in FIG. 5.
Figure 9B:
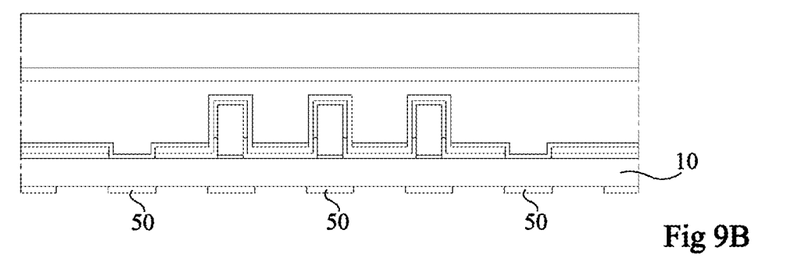
Figure 9C:
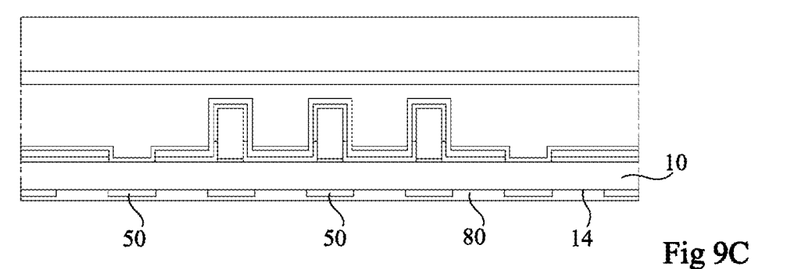
Figure 9D:
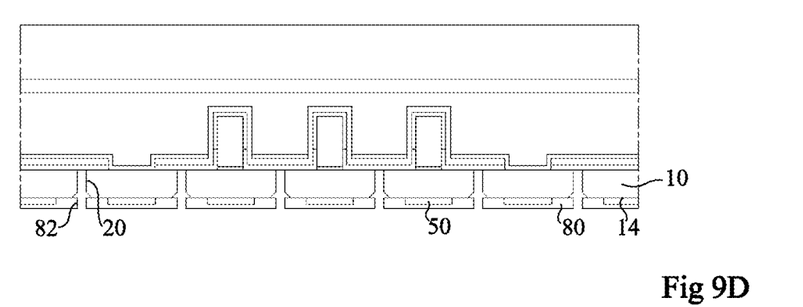
Figure 9E:
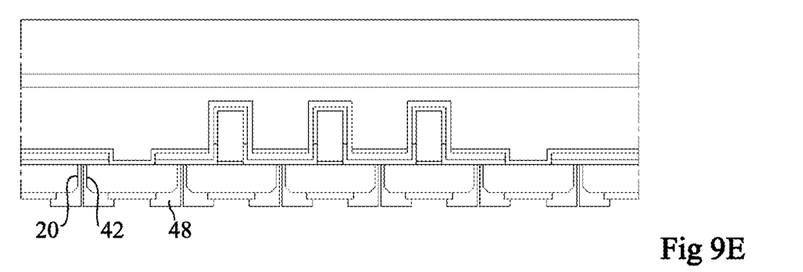

The present embodiment of the method of manufacturing optoelectronic device 70 comprises the following steps:

forming light-emitting diodes DEL, insulating layer 32, electrode layer 36, openings 39 in layers 32 and 36, conductive layer 38, and encapsulation layer 40, fixing the structure obtained to handle 72 via adhesive layer 74 and thinning substrate 10 (FIG. 9A) as previously described in relation with FIGS. 6A to 6C;

forming conductive pads 50 on rear surface 14 (FIG. 9B). An advantage of the present embodiment is that conductive pads 50 are formed on a plane surface 14 which does not include openings;

forming a sacrificial layer 80 (FIG. 9C), for example a metal or dielectric layer of a material other than conductive pads 50, sacrificial layer 80 covering conductive pads 50 and rear surface 44 of thinned substrate 10;

etching openings 82 in sacrificial layer 80 and etching openings 20, in the extension of openings 82, crossing through substrate 10 and stopping on insulating layer 32 (FIG. 9D). The etching of sacrificial layer 80 and substrate 10 may be a DRIE etching;

removal of sacrificial layer 80 and forming insulating blocks 42 in openings 20, forming insulating layer 48 on rear surface 14 of thinned substrate 10 and etching of insulating layer 48 to expose portions of conductive pads 50 (FIG. 9E). The formation of insulating blocks 42 and of insulating layer 48 may be a conformal deposition which leads to partial filling of openings 20.

Specific embodiments of the present invention have been described. Various alterations and modifications will occur to those skilled in the art. Further, although, in the previously-described embodiments, each wire 26 comprises a passivated portion 28 at the base of the wire in contact with one of seed pads 24, passivated portion 28 may be absent.

Further, although embodiments have been described for an optoelectronic device for which each light emitting diode comprises a three-dimensional semiconductor element 26, in particular a wire, and shell 34 which covers the top of wire 26 and part of the side flanks of wire 26, it is clear that the structure of light emitting diodes may be different. By way of example, each light-emitting diode can comprise a three-dimensional semiconductor element, in particular a wire, only the top of which is covered by the shell. According to another example, each light-emitting diode can be formed by the stack of flat layers.

The invention claimed is:

1. A method of manufacturing an optoelectronic device comprising the following successive steps:
   a) providing a substrate having a first surface;
   b) forming openings extending in the substrate from the first surface, surrounding portions of the substrate, the openings in step b) not completely crossing the substrate, each opening being filled with at least one filling element;
   c) forming at least one light-emitting diode resting on the first surface for each portion of the substrate, the at least one light-emitting diode comprising wired, conical, or frustoconical semiconductor elements;
   d) forming an electrode layer covering the at least one light-emitting diode and a conductive layer covering the electrode layer around the at least one light-emitting diode;
   e) forming a layer encapsulating the at least one light-emitting diode and covering the entire first surface;
   f) reducing the thickness of the substrate, the substrate comprising, after step f), a second surface opposite the first surface, the openings extending, after step f), from the first surface to the second surface;
   g) removing the at least one filling element; and
   h) forming insulation trenches surrounding the portions of the substrate and electrically insulating the portions from one another, comprising forming in each opening at least one electrically insulating block or an electrically conductive element, each insulation trench being filled with said at least one electrically insulating block and a gaseous volume or with said electrically conductive element electrically isolated from the substrate.

2. The method of claim 1, comprising, prior to step b), for each insulation trench, etching the opening in the substrate from the first surface over a part of the thickness of the substrate, the opening being opened on the second surface in step f).

3. The method of claim 1, wherein each insulation trench comprises side walls, the method comprising forming an electrically insulating layer covering the side walls.

4. The method of claim 1, wherein each insulation trench is at least partially filled by said at least one electrically insulating block, said at least one electrically insulating block and the electrically insulating layer being made of different materials.

5. The method of claim 1, wherein each insulation trench comprises said electrically conductive element, the electrically conductive elements being electrically connected, on the side of the first surface, to the electrode layer or the conductive layer, the method comprising forming, on the second surface, second electrically conductive pads electrically connected to the electrically conductive elements.

6. The method according to claim 1, comprising a step of fixing a support to the layer encapsulating the at least one light-emitting diode.

7. The method according to claim 1, comprising forming, for each portion of the substrate, at least a first conductive pad resting on the second surface and in contact with the portion of the substrate.

8. The method according to claim 1, wherein the at least one filling element is made of polycrystalline silicon, doped or undoped, or of metal.

* * * * *